(12) United States Patent
Morino et al.

(10) Patent No.: US 7,306,467 B2
(45) Date of Patent: Dec. 11, 2007

(54) SLOT DEVICE

(75) Inventors: Takayuki Morino, Yamato (JP);
Hiroyuki Noguchi, Fujisawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/327,576

(22) Filed: Jan. 6, 2006

(65) Prior Publication Data

US 2006/0174046 A1   Aug. 3, 2006

(30) Foreign Application Priority Data

Jan. 7, 2005  (JP) .............................. 2005-002102

(51) Int. Cl.
*H01R 12/00* (2006.01)
(52) U.S. Cl. .................. 439/64; 439/377; 439/630
(58) Field of Classification Search .............. 439/64, 439/377, 630, 374
See application file for complete search history.

(56) References Cited

U.S. PATENT DOCUMENTS

| | | | | |
|---|---|---|---|---|
| 4,017,770 A | * | 4/1977 | Valfre ........................ | 361/756 |
| 4,579,408 A | * | 4/1986 | Sasaki ........................ | 439/153 |
| 5,176,523 A | * | 1/1993 | Lai ............................. | 439/64 |
| 5,511,986 A | * | 4/1996 | Casey et al. ................ | 439/188 |
| 5,775,949 A | * | 7/1998 | Bricaud et al. ............. | 439/630 |
| 5,853,297 A | * | 12/1998 | Moulton et al. ............ | 439/327 |
| 6,077,098 A | * | 6/2000 | Yu et al. ..................... | 439/326 |
| 6,095,868 A | * | 8/2000 | Hyland et al. .............. | 439/630 |
| 6,361,350 B2 | * | 3/2002 | Johnson et al. ............. | 439/374 |
| 6,406,304 B1 | * | 6/2002 | Kuo ............................ | 439/64 |
| 6,511,350 B1 | * | 1/2003 | Ito et al. ..................... | 439/680 |
| 7,077,705 B2 | * | 7/2006 | Harasawa .................... | 439/630 |
| 7,097,510 B1 | * | 8/2006 | Chen ........................... | 439/630 |
| 2003/0157839 A1 | * | 8/2003 | Yamaguchi et al. ........ | 439/630 |
| 2005/0130506 A1 | * | 6/2005 | Kato et al. .................. | 439/686 |
| 2005/0287861 A1 | * | 12/2005 | Wong et al. ................ | 439/377 |
| 2006/0183378 A1 | * | 8/2006 | Tanaka et al. .............. | 439/630 |

* cited by examiner

*Primary Examiner*—Gary Paumen
(74) *Attorney, Agent, or Firm*—Carlos Munoz-Bustamante; Dillon & Yudell LLP

(57) ABSTRACT

A PC card slot device for an ExpressCard affords a smooth insertion of the ExpressCard into a slot for the PC card slot device, without the height of the slot being increased. A lower chassis ceiling wall defines the lower face side of a card storage space, and also includes a slot side edge that is formed of a rear-side inclined line portion and a slot-side inclined line portion. The rear-side inclined line portion and the slot-side inclined line portion are respectively inclined at angles $\alpha 1$ and $\alpha 2$, relative to a reference cross section. To insert the ExpressCard into the slot of the card storage space, the right corner of the right upper level lower face portion of the card is inserted into the card storage space and the front end of the right stepped portion of the card is guided along the inclined line portions.

6 Claims, 7 Drawing Sheets

SLOT DEVICE

PRIORITY CLAIM

This application claims priority of Japanese Patent Application No. 2005-2102, filed on Jan. 7, 2005, and entitled, "Slot Device."

BACKGROUND OF THE INVENTION

1. Technical Field

The present invention relates to a slot device, such as an ExpressCard slot device, mounted in a notebook computer, and particularly relates to a slot device that facilitates the smooth insertion of a card type inversion/ejection member into a slot.

2. Description of the Related Art

Currently, typical notebook computers are equipped with PC card slot devices. The specifications for PC cards are standardized by the PCMCIA (Personal Computer Memory Card International Association), and PC cards are employed as extension devices for personal computers (hereinafter referred to as "PCs"; note, however, that the term "PC card" is itself a proper noun, and does not correspond to the term "personal computer card"). In Japanese Patent Laid-Open Publication No. 2000-182712, while taking into account a situation wherein a user has trouble aligning a PC card with and inserting the PC card in a card slot, a structure is disclosed that facilitates the insertion of a PC card. According to this Japanese Patent Laid-Open Publication No. 2000-182712 a slot device is equipped with a movable tray. When a user presses on the push rod of an eject mechanism, the movable tray is extracted and positioned outside of the PC card slot device. The user then places a PC card on the movable tray and pushes the movable tray back into the storage space.

In Japanese Patent Laid-Open Publication No. 2004-213505, a slot device is disclosed that can be used in common for two types of cards, i.e., a wide, thick card and a narrow, thin card. According to the slot device, a card guide mechanism is arranged at the entrance to a card slot, and in accordance with the type of card that is to be inserted, guides the card into one of the card slot sections in the storage space.

In Japanese Patent Laid-Open Publication No. 2004-63197, in accordance with the type of card inserted, a slot device moves a movable member equipped with a contact piece so that, regardless of the card type, the contact piece can contact the electrode of the card. Thus, the number of parts required can be reduced.

SUMMARY OF THE INVENTION

At present, the PCMCIA has proposed, as new standards, two types of ExpressCards: one, 54 mm wide and the other, 34 mm wide, for which a general ExpressCard slot device is to be produced that can be used in common for both ExpressCard sizes. The ExpressCard must be moved to the rear of the storage space, while maintained horizontally therein, so that the card front end, which is to be inserted into a connector, is located at the rear of the storage space. Therefore, guide walls are formed on both sides of the storage space, and in a dedicated ExpressCard slot device, an ExpressCard is moved to the rear while the right and left sides are guided along the side walls of the slot device, and the obverse and reverse faces of the ExpressCard are horizontally maintained. On the other hand, in the ExpressCard slot device used for ExpressCards having 54 and 34 mm widths, since the guide wide walls are formed to accept an ExpressCard having a width of 54 mm, it is difficult for a narrow ExpressCard having a width of 34 mm to be moved to the rear of the storage space, while the horizontal posture is maintained along the right and left guide walls. Thus, a lower wall is provided for an ExpressCard slot device for two types of ExpressCards, so that an ExpressCard having a width of 34 mm can be moved to the rear, while the lower face of the ExpressCard contacts the lower wall. It should be noted that a partition that vertically defines levels is not formed for a typical PC card slot device for two upper and lower levels.

The front end of a PC card is thinner than the main body so that it can easily be inserted along the left and right guide walls, while the thickness of the front end of an ExpressCard is equal to that of the succeeding main body, i.e., its thickness is equal to that of the slot. Therefore, when an ExpressCard is inserted into the slot, the ExpressCard contacts the upper and lower walls of the slot, and insertion is not easy.

According to a general countermeasure for resolving this problem, the height of the slot is increased. In this case, accordingly, the size, the thickness, of the slot device is also increased, and for the downsizing of the slot device, this means is very disadvantageous.

According to the PC card slot device described in Japanese Patent Laid-Open Publication No. 2000-182712, since the movable tray that interlocks with the push rod of the ejection mechanism is provided, the structure is complicated.

Further, according to the slot devices described in Japanese Patent Laid-Open Publication No. 2004-213505 and Japanese Patent Laid-Open Publication No. 2004-63197, the structures are related to the guidance of a card and the movement of the contact piece, used in common, after the front end of the card has been inserted into the slot, and no structure is described whereby the insertion of the card into the slot can be efficiently performed.

The present invention thus provides a slot device that enables the efficient insertion, into a slot, of a card type insertion/ejection member such that the front of the card, in the insertion direction, need not be formed thinner than the succeeding portion, and for which the height of the slot need not be increased. Described herein is a slot device that is capable of receiving both a 34 mm ExpressCard and a 54 mm ExpressCard, wherein the slot device includes oblique guides that laterally direct the 34 mm ExpressCard and the 54 mm ExpressCard to appropriate male connectors in the slot device. The slot device affords a smooth insertion of both the 34 mm ExpressCard and the 54 mm ExpressCard without a height of the slot device being increased. The slot device further includes: a lower chassis ceiling wall that defines a lower face side of a card storage space; and a slot side edge that is formed from a rear-side inclined portion and a slot-side include portion, wherein the rear-side inclined portion and the slot-side inclined portion are respectively inclined at angles $\sigma 1$ and $\sigma 2$, wherein angles $\sigma 1$ and $\sigma 2$ are relative to a reference cross section of the slot device, and wherein $\sigma 1 < \sigma 2$ to optimize guidance of the 34 mm ExpressCard and the 54 mm ExpressCard towards their respective male pins in the slot device.

DETAILED DESCRIPTION OF THE INVENTION

Figure 1:
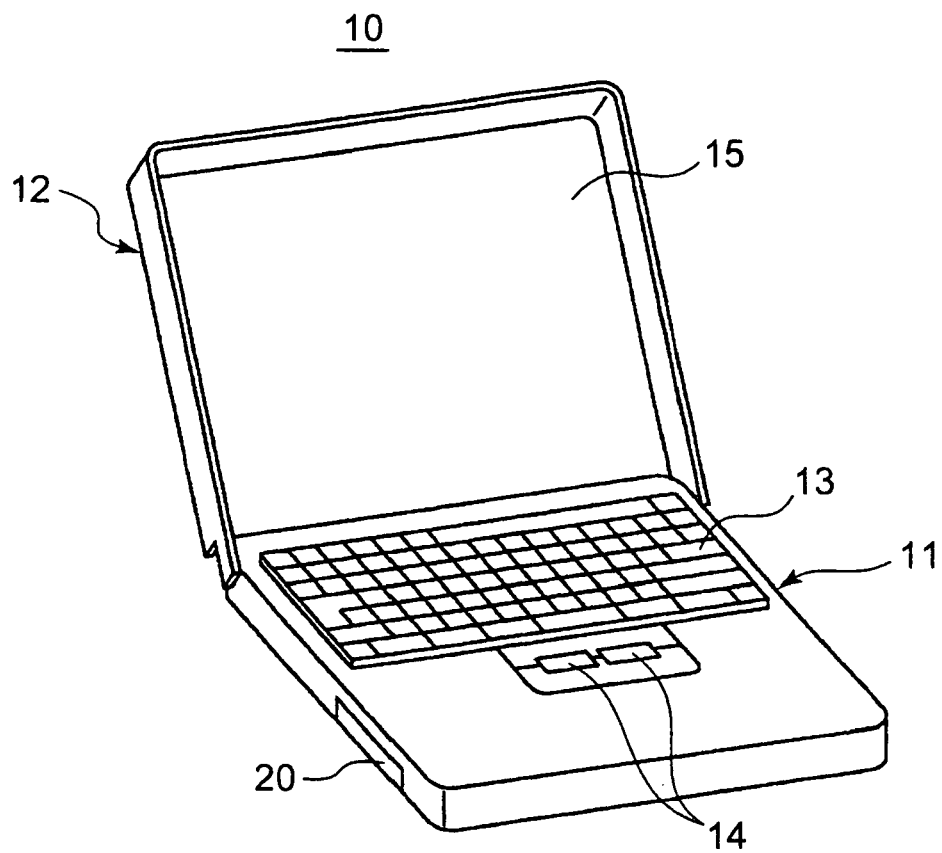
FIG. 1 is a perspective view of a notebook PC.

Reference is now made to the figures, and particularly to FIG. 1, which is a perspective view of a notebook PC 10. The notebook PC 10 includes: a PC main body 11; and a cover 12, the lower end of which is rotatably attached to the rear side of the PC main body 11 so as to expose and cover the upper face of the PC main body 11. A keyboard 13 and a clicking key 14 are provided on the upper face of the PC main body 11, and the clicking key 14 is positioned in front of the keyboard 13. A color liquid crystal display device 15 is mounted on the inner face of the cover 12. A PC (personal computer) slot device 20 is mounted in the PC main body 11 so that an ExpressCard or a PC card can be inserted into or extracted from the side of the PC main body 11. The PC slot device 20 has a door that is closed to hide the internal slot when a card, such as an ExpressCard, has not been inserted into the PC slot device 20. When the front end of a card, such as an ExpressCard, abuts upon the door, the door is moved to the inside by the pressing force applied, and exposes the slot, permitting the insertion of an ExpressCard, or another card, into the slot.

For the sake of convenience for the explanation, the vertical direction (also referred to, for the sake of convenience, as the "height direction"), the direction of the sides and the direction from the front to the rear are defined for 34 mm wide ExpressCards 25 and 25b (FIGS. 2 to 7) and a 54 mm wide ExpressCard 60 (FIGS. 8 and 9) that will be described later. The vertical direction and the directions of the sides of these ExpressCards are defined as such when the ExpressCards are inserted into the PC slot device 20 in FIG. 1. Further, the directions for the front and the rear of the ExpressCard are defined relative to the direction in which an ExpressCard is inserted into the PC slot device 20, and forward and rearward relative to the insertion direction corresponds to forward and rearward in the directions traveled by the front and rear of the ExpressCard. The right and the left in the directions of the sides of the ExpressCard correspond to the right and the left, in the directions of the sides, when the ExpressCard is viewed from the rear in the direction from the rear to the front. Further, the vertical direction, the directions of the sides, the top, the bottom, the right and left of the PC slot device 20 match the vertical direction, the directions of the sides, the top, the bottom, the right and the left of an ExpressCard that is present in the PC slot device 20. In addition, the direction of the depth of the PC slot device 20 matches the direction from the front to the rear of the ExpressCard that is present in the PC card slot device 20. The slot side, which serves as an entrance/exit, and the rear side, on which a connector is mounted, opposite the slot side, are defined as the direction of depth of the PC slot device 20. It should be noted that, depending on the direction in which a PC slot device 20 or an ExpressCard is viewed, the right and the left in the drawings may not match the original right and left of the PC slot device 20 or the ExpressCard.

The PC slot device 20 of the notebook PC 10 is for a transverse ExpressCard insertion type (an ExpressCard insertion type for which the widthwise direction is horizontal). However, there is a vertical insertion type PC (an ExpressCard insertion type for which the widthwise direction is vertical) for slot devices mounted on desktop PCs. The vertical and the horizontal directions of an ExpressCard for a vertical insertion type PC slot device correspond to the width and the thickness directions of a transverse ExpressCard insertion type.

Figure 2:
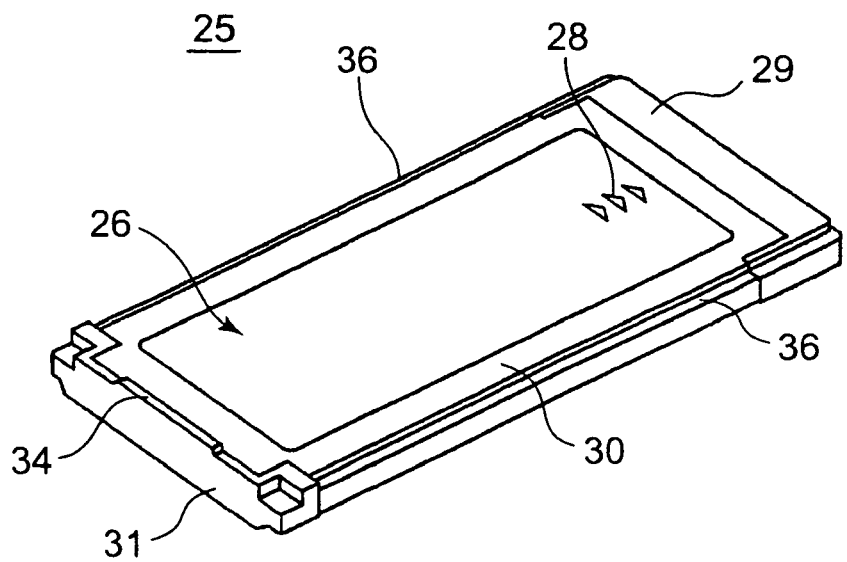
FIG. 2 is a perspective view of a 34 mm wide ExpressCard, as viewed obliquely from above the upper face.
Figure 11:
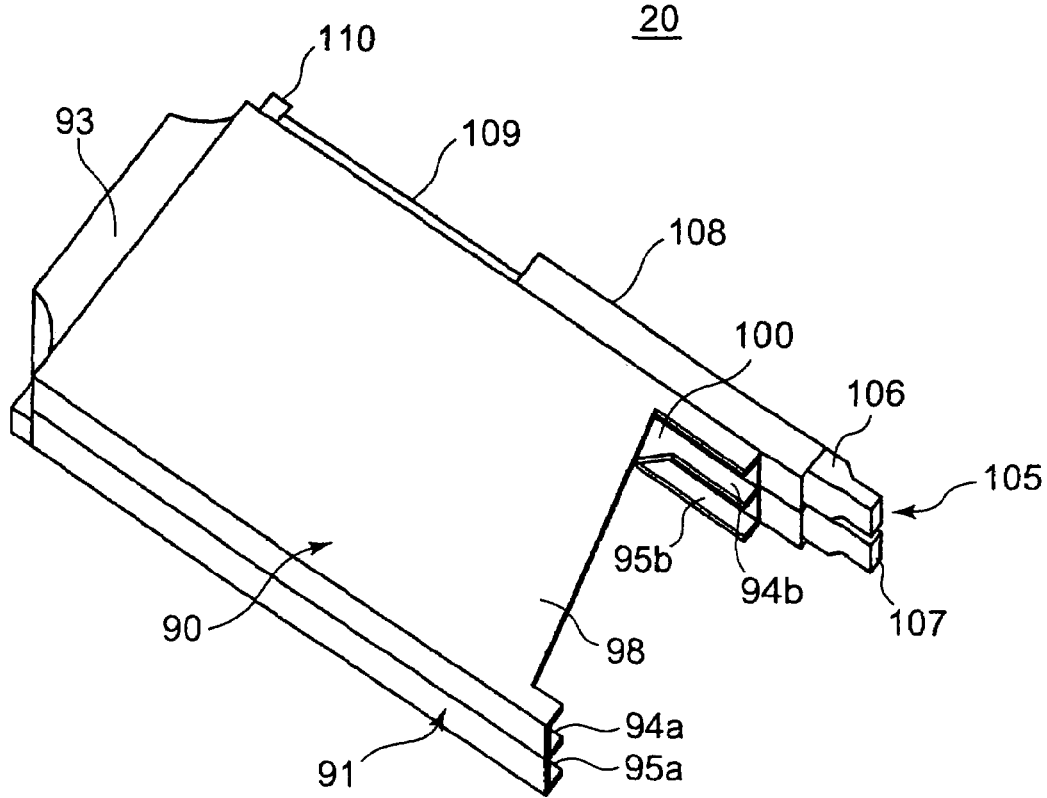
FIG. 11 is a perspective view of a PC slot device.

FIG. 2 is an oblique, upper perspective view of an upper face 26 of a 34 mm wide ExpressCard 25. According to the PCMCIA standards, the size of an ExpressCard from the front to the rear is 75 mm. The 34 mm ExpressCard 25 includes, from the front to the rear, beginning at the front, a resin front end side mounting member 29, a metal case 30 and a resin rear end side mounting member 31. On the upper face of the rear end side mounting member 31, a catching projection 34 is projected upward in the center in the direction of the side at the rear end of the 34 mm ExpressCard 35. The catching projection 34 is still exposed outside an ExpressCard storage space 103 (FIG. 13) after the 34 mm ExpressCard 25 has been inserted into the PC slot device 20, so that a user can externally remove the 34 mm ExpressCard 25 from the PC slot device 20 by catching the catching projection 34 with, for example, a fingernail, instead of manipulating an ejection device 105 (FIG. 11). Upper grooves 36 are formed along right and left side edges of the upper face 26, and are extended from the front to the rear of the 34 mm ExpressCard 25. An insertion direction mark 28 is typically printed on a seal that is to be adhered to the metal case 30 on the upper face 26, and indicates, to a user, that the face on which the insertion direction mark 28 is shown is the upper face of the ExpressCard, and that the direction indicated by the insertion direction mark 28 is the direction in which an ExpressCard is to be inserted into the PC card slot device 20.

Figure 3:
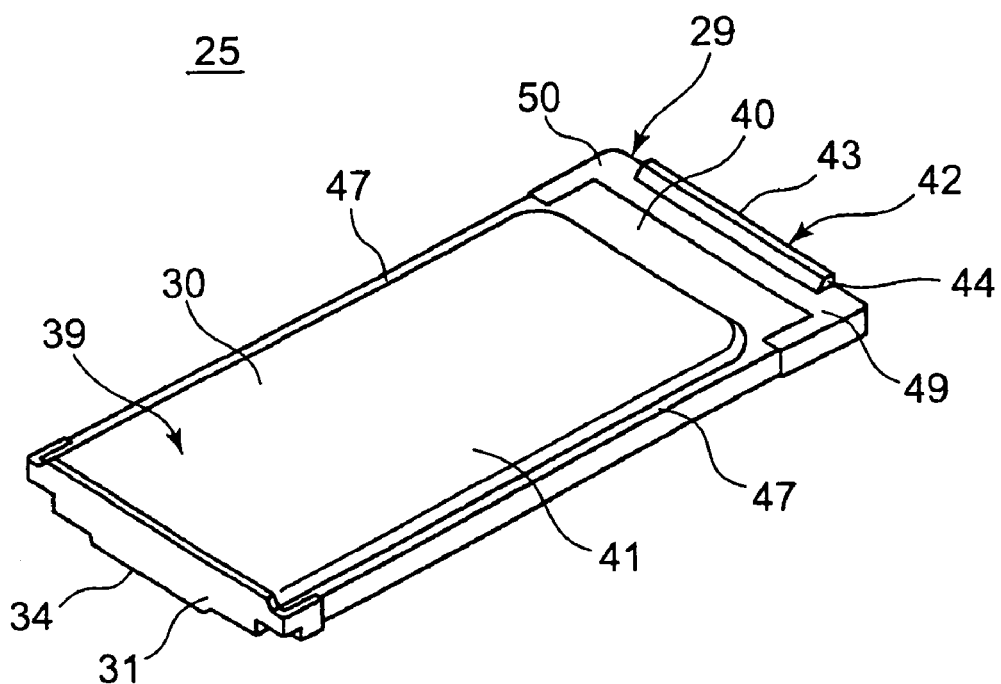
FIG. 3 is a perspective view of the 34 mm wide ExpressCard, as viewed obliquely from below the lower face.

FIG. 3 is a perspective view of a 34 mm ExpressCard, viewed obliquely from below a lower face 39. The lower face 39 of the 34 mm ExpressCard 25 includes an upper-level lower face 40, a case lower face 41 and a front end projection member 42. The lower face 39 is formed of two level stages, and the upper-level lower face 40 is formed within a range, in the directions to the front and rear, that covers the front end side mounting member 29 and the metal case 30. The case lower face 41 at the lower level occupies most of the lower portion of the metal case 30, and the front end projection member 42 is integrally formed with the front end side mounting member 29 at a position at the front end of the 34 mm wide ExpressCard. The case lower face 41 and a projection lower face 43, of the front end projection member 42, are located at the lowermost end position of the 34 mm wide ExpressCard 25, while the upper-level lower face 40 is located at a position a little higher than the case lower face 41 and the projection lower face 43 (a position higher by 1.00 mm according to the PCMCIA standards). Step portions 44 are formed upright, from the upper-level lower face 40, and located on both sides of the front end projection member 42 in the direction of the sides. A left, upper-level lower face portion 49 and a right, upper-level lower face portion 50, which serve as part of the upper-level lower face 40, occupy a range that extends from the front edge of the front end projection member 49 to the front end of the case lower face 41 in the direction from the front to the rear, and are positioned to the left and to the right relative to the front end projection member 42. A lower groove 47 is extended along the right and left side edges of the case lower face 41, and is aligned at the same height as that of the upper-level lower face 40.

Figure 4:
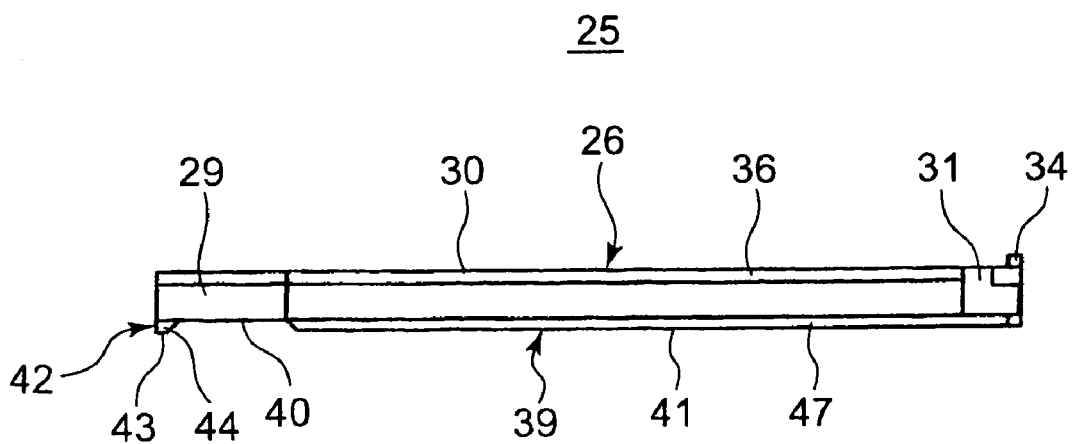
FIG. 4 is a left side view of the 34 mm wide ExpressCard.

FIG. 4 is a left side view of the 34 mm wide ExpressCard 25. On the upper face 26, portions other than the catching projection 34 and the upper grooves 36 are arranged at the same height. On the lower face 39, the case lower face 41 and the projection lower face 43 are present at the same height, and the upper-level lower face 40 is located at a position a little higher than the case lower face 41 and the projection lower face 43. Therefore, to the front and to the rear, the 34 mm wide ExpressCard is thicker at the positions of the case lower face 41 and the projection lower face 43, and thinner at the position of the upper-level lower face 40.

Figure 5:
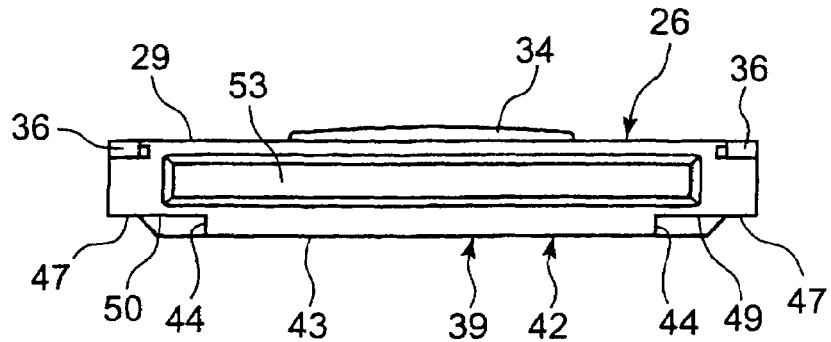
FIG. 5 is a front view of the front end face of the 34 mm wide ExpressCard.
Figure 12:
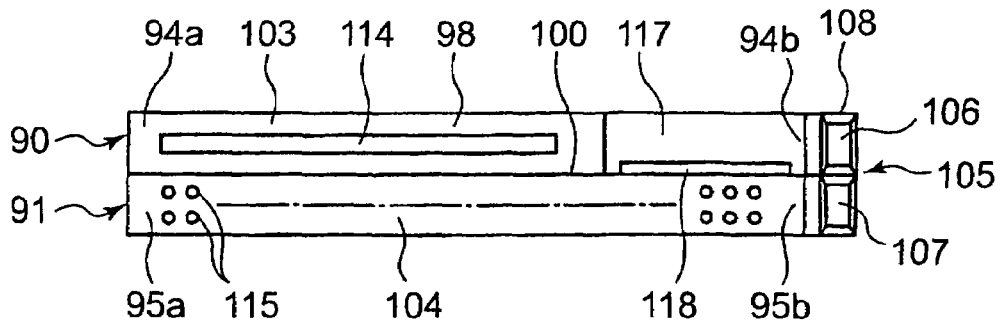
FIG. 12 is a diagram showing the PC slot device as viewed from a slot.

FIG. 5 is a front view of the front end face of the 34 mm ExpressCard 25. Laterally, the front end face of the 34 mm wide ExpressCard is symmetrically shaped. On the front end face of the 34 mm wide ExpressCard 25, the left upper-level lower face portion 49 and the right upper-level lower face portion 50 are slightly higher than the projection lower face 43. A female connector 53 is open in the front end face of the 34 mm ExpressCard 25, for the internal insertion of an ExpressCard male connector 114 (FIG. 12).

According to this 34 mm wide ExpressCard 25, the upper-level lower face 40 is arranged between the front end projection member 42 and the case lower face 41 in the direction from the front to the rear. However, according to the PCMCIA standards for ExpressCards, the portions of the upper-level lower face 40, other than the left upper-level lower face portion 49 and the right upper-level lower face 50, may be arranged at the same height as the projection lower face 43.

Figure 6:
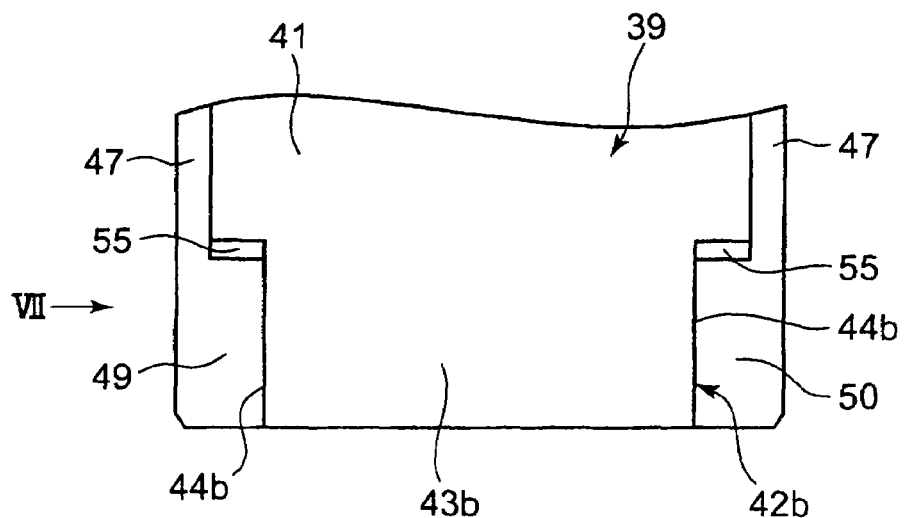
FIG. 6 is a bottom view of the front end portion of the lower face of a 34 mm wide ExpressCard, where a front end projection member and a case lower face are continued on a lower face in the direction from the front to the rear.
Figure 7:
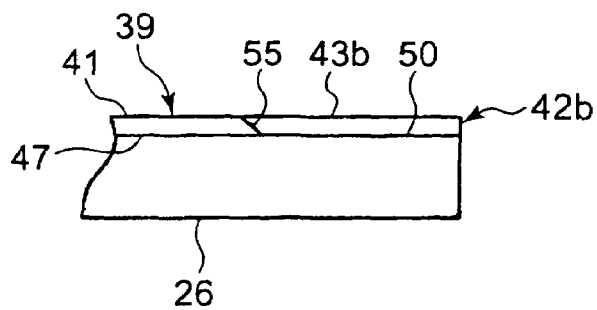
FIG. 7 is a view taken along a line VII in FIG. 6.

FIG. 6 is a bottom view of the front end portion of a lower face 39 of a 34 mm wide ExpressCard 25b whereat a front end projection member 42b and a case lower face 41 are connected in the directions from the front to the rear. FIG. 7 is a view taken along a line VII in FIG. 6. It should be noted that the top and the bottom in FIG. 7 are the reverse of the actual top and bottom of the 34 mm wide Express-Card. Further, the same reference numerals as used for the 34 mm wide ExpressCard 25 are also employed to denote corresponding portions and components of the 34 mm ExpressCard 25b. A projection lower face 43b has the same height as the case lower face 41, and the rear end of the projection lower face 43b is continued on to the front end of the case lower face 41. A left upper-level lower portion 49 and a right upper-level lower face portion 50 exist within the same range as the projection lower face 43b in the direction from the front to the rear. The right and left ends of the case lower face 41 are extended outward from the right and left ends of the projection lower face 43b. Inclined faces 55 are present as portions that connect the left upper-level lower face portion 49 and the right upper-level lower face portion 50 to the case lower face 41, and gradually descend from the left upper-level lower face portion 49 and the right upper-level lower face portion 50 to the case lower face 41.

Figure 8:
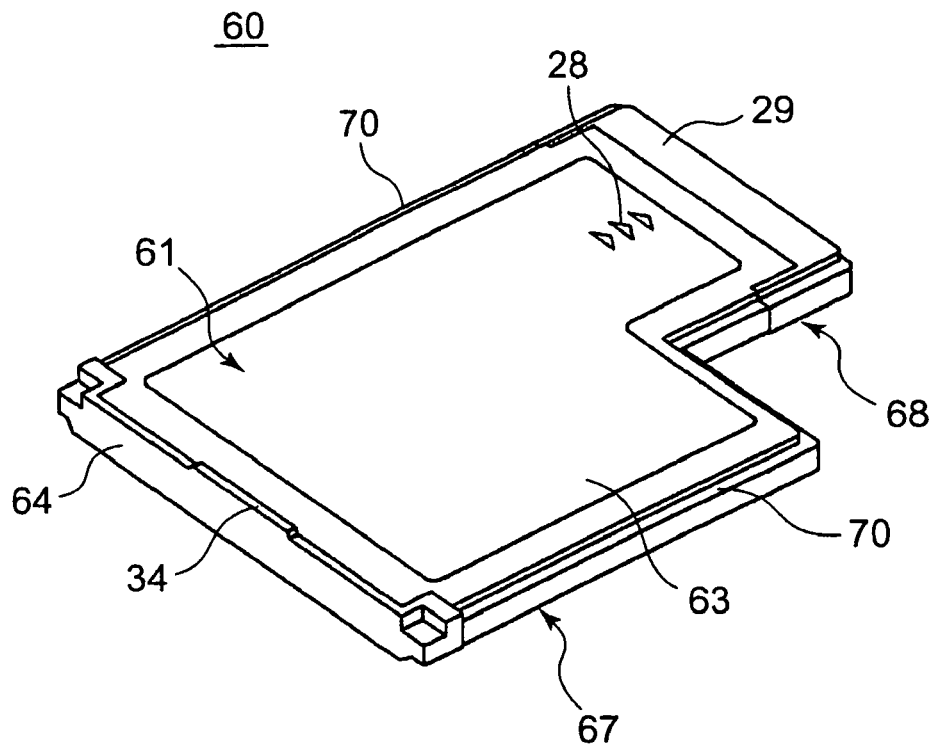
FIG. 8 is a perspective view of a 54 mm wide ExpressCard, as viewed obliquely from above the upper face.

FIG. 8 is a perspective view of a 54 mm ExpressCard 60, viewed obliquely from above the side of an upper face 61. The same reference numerals used for the 34 mm wide ExpressCard 25 are also employed to denote corresponding portions and components of the 54 mm wide ExpressCard 60. The 54 mm wide ExpressCard 60 includes, in the direction from the front to the rear, a front end side mounting member 29, a metal case 63 and a resin rear end mounting member 64. Further, based on a difference in the widthwise size, the ExpressCard 60 of 54 mm wide is divided into a widthwise main body 67 and a widthwise narrow portion 68, which projects forward from the widthwise main body 67. Since the left ends, widthwise, of the main body 67 and the narrow portion 68 are aligned in the direction of the sides, the 54 mm ExpressCard 60 is shaped like a rectangle, with a rectangular, vertical 22 mm×horizontal 20 mm area missing at the right front end. A left upper groove 70 is extended all along the 54 mm wide ExpressCard 60 in the direction from the front to the rear, while a right upper groove 70 is extended along the widthwise main body 67 in the direction from the front to the rear. The left side view of the 54 mm wide ExpressCard 60 is the same as that (FIG. 4) of the 34 mm wide ExpressCard 25.

Figure 9:
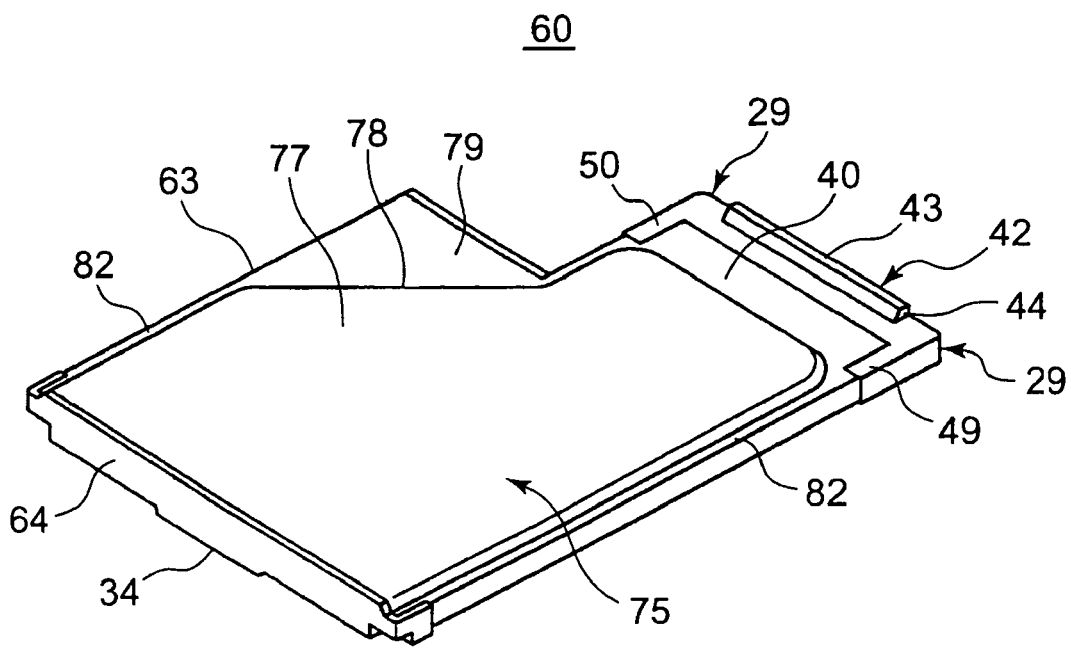
FIG. 9 is a perspective view of the 54 mm wide ExpressCard, as viewed obliquely from below the lower face.

FIG. 9 is a perspective view of the 54 mm wide Express-Card 60, viewed obliquely from below the side of a lower face 75. On the lower face 75, the shapes of the individual portions of a front end side mounting member 29 and the structure of the front end side mounting member 29 are the same as those (FIG. 3) for the 34 mm wide ExpressCard 25. The lower face of the metal case 63 is divided into a lower-level lower face 77 and an upper-level lower face 79, and a connecting inclined face 78 connects the lower-level lower face 77 to the upper-level lower face 79 at a predetermined inclination angle. The upper-level lower face 79 occupies a triangular angle at the right front end on the lower face of the metal case 63, and is aligned at the same height as the upper-level lower face 40. The lower-level lower face 77 occupies the area of the metal case 63, other than the upper-level lower face 79, and is aligned at the same height as the projection lower face 43 of the front end projection member 42. A left lower groove 82 is extended along the left side edge of the widthwise main body 67 and the widthwise narrow portion 68, and a right lower groove 82 is extended along the right side edge of the widthwise main body 67. The step portion of the upper-level lower face 40 and the lower grooves 82, relative to the lower-level lower face 77 is formed as an inclined face, as is the connecting inclined face 78.

Figure 10:
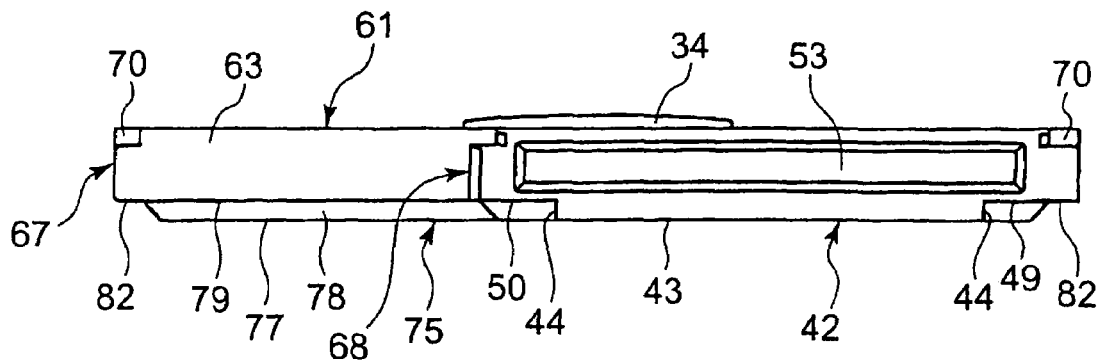
FIG. 10 is a front view of the 54 mm wide ExpressCard.

FIG. 10 is a front view of the 54 mm wide ExpressCard 60. The shape and the structure of the front end face of the widthwise narrow portion 68 are the same as those of the 34 mm wide ExpressCard 25 (FIG. 5). The upper-level lower face 79 of the ExpressCard 60 of 54 mm is formed in order to permit the 54 mm wide ExpressCard 60 to run up over a guide projection 118 (FIG. 12), which will be described later, and to enter the rear of the ExpressCard storage space 103.

FIG. 11 is a perspective view of the PC slot device 20, and FIG. 12 is a diagram showing the PC slot device 20, as viewed from the slot side. The PC slot device 20 is of an upper and a lower level type, and includes upper and lower metal chassis 90 and 91 that are vertically laminated. A connector member 93, made of resin, is fitted to the opening at the rear of the upper and lower chassis 90 and 91. The upper chassis 90 includes an upper chassis ceiling wall 98, and right and left suspended walls that are suspended from the right and left side edges of the upper chassis ceiling wall 98 and that internally define the ExpressCard storage space 103. The lower chassis 91 includes a lower chassis ceiling wall 100, and right and left suspended walls that are suspended from the right and left side edges of the lower chassis ceiling wall 100 and that internally define a PC card storage space 104. Through the slot, as an entrance, an ExpressCard or a PC card are to be inserted into the ExpressCard storage space 103 and the PC card storage space 104. The right and left suspended walls of the upper chassis 90 serve as right and left guides 94a and 94b for the ExpressCard storage space 103, and the right and left suspended walls of the lower chassis 91 serve as right and left side guides 95a and 95b for the PC card storage space 104.

An ejection device 105 includes: push rods 106 and 107, which are vertically arranged; a guide case 108, which is fixed to the outer surfaces of the right side walls of the upper and lower chassis 90 and 91 to guide the push rods 106 and 107 in the direction from the front to the rear; and transmission plates 109, for transmitting the forward displacements of the push rods 106 and 107 to rotation levers 110. In FIG. 11, the transmission plate 109 and the rotation lever 110 are shown only on the upper side, i.e., only for the push rod 106; however, the other lower transmission plate 109 and the other rotation lever 110 (neither of them shown) are present for the lower push rod 107, i.e., for the ejection of a PC card.

A male connector 114 for ExpressCards is formed at the end face of the connector member 93, near the ExpressCard storage space 103, so that the male connector 114 faces, at the rear, the ExpressCard storage space 103, and is to be inserted into the female connector 53 (FIG. 5) of a 34 mm wide ExpressCard 25 that has been appropriately inserted into the ExpressCard storage space 103. Multiple male pins 115 for PC cards are formed at the end face of the connector member 93, near the PC card storage space 104, so that the male pins 115 face, on the rear side, the PC card storage space 104. The male pins 115 consist of an upper and lower array, and are to be inserted into the individual female terminals at the front end of a PC card (not shown) as the PC card is fully inserted into the PC card storage space 104.

When an ExpressCard 25 or a PC card is inserted into the ExpressCard storage space 103 and the PC card storage space 104 until the card is connected to the ExpressCard male connector 114 and the PC card male pins 115, the rotation levers 110 (the lower rotation levers 110 are not shown in FIG. 11) of the ejection device 105 are rotated by the front end faces of the 34 mm wide ExpressCard 25 or the PC card. Therefore, when the rotation levers 110 are rotated in a direction opposite to that when the ExpressCard 25 or the PC card is connected, the ExpressCard 25 or the PC card is moved to the rear from the ends (not shown) of the rotation levers 110, and are disconnected from the ExpressCard male connector 114 and the PC card male pins 115. Predetermined grooves are formed in the transmission plates 109, and when the exposed ends of the rotation levers 110 are changed from card disconnection positions (rear positions) to card connection positions (slot side positions), the transmission plates 109 do not transmit the displacement of the rotation levers 110 to the push rods 106 and 107. When the rotation levers 110 are at the card connection positions, and the push rods 106 and 107 are displaced forward, the transmission plates 109 transmit the displacement of the push rods 106 and 107 to the rotation levers 110, so that the rotation levers 110 can be changed from the card connection positions to the card disconnection positions. As previously described, the ExpressCard 25 has the catching projection 34 at the rear end, so that a user can extract the ExpressCard 25 from the ExpressCard storage space 103 by pulling the catching projection 34 with a finger, without employing the push rod 106.

The guide projection 118 is formed by cutting up the portion of the lower chassis ceiling wall 100, and is obliquely projected toward the ExpressCard storage space 103, and extended from the right to the left end, to the rear from the slot side of the ExpressCard storage space 103. Instead of cutting up the metal portion of the lower chassis ceiling wall 100, the guide projection 118 may be a resin member fixed to the upper surface of the lower chassis ceiling wall 100. When the ExpressCard 25 is shifted to the right, from the normal position, and inserted into the ExpressCard storage space 103, the guide projection 118 abuts upon the right end on the front face of the front end projection member 42 and guides the ExpressCard to the left, so as to smoothly insert the ExpressCard male connector 114 into the female connector 53 of the front end side mounting member 29. A straight-sided spacer 117 is formed in the ExpressCard storage space 103, at the rear of the guide projection 118, and has an outline that corresponds to the outline of the notch at the front right end of the 54 mm wide ExpressCard 60 (FIG. 9). The notch at the right front end of the 54 mm wide ExpressCard 60 is used to avoid the reverse-side insertion of the 54 mm side ExpressCard 60, and also to avoid interference between the 54 mm wide ExpressCard 60 and the straight-sided spacer 117 when the ExpressCard 60 is inserted in the correct direction of the sides.

Figure 13:
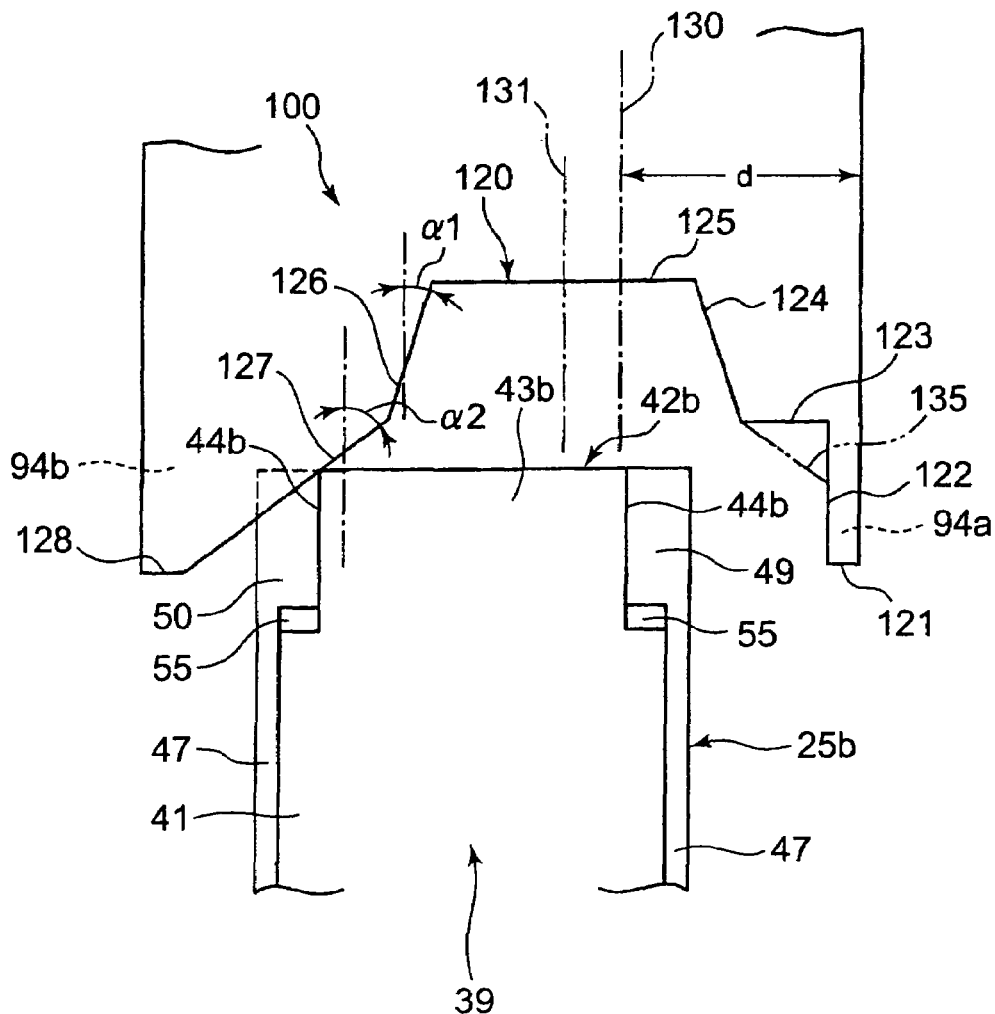
FIG. 13 is a diagram showing a positional relationship between a lower chassis ceiling wall and a 34 mm wide ExpressCard, as viewed from the lower face of the lower chassis ceiling wall, when insertion of the 34 mm wide ExpressCard into an ExpressCard storage space is begun.

FIG. 13 is a diagram showing the positional relationship of the lower chassis ceiling wall 100 and the 34 mm wide ExpressCard 25b, as viewed from the side of the lower face of the lower chassis ceiling wall 100, when insertion of the 34 mm wide ExpressCard 25b into the ExpressCard storage space 103 is begun. The right and left in FIG. 13 are the opposite of the actual right and left of the 34 mm wide ExpressCard 25b. The lower chassis ceiling wall 100 has a slot side edge 120 having a specific shape. The slot side edge 120 is formed, from the left end to the right end, of a transverse line portion 121, a vertical line portion 122, a transverse line portion 123, an inclined line portion 124, a transverse line portion 125, a rear-side inclined line portion 126, a slot-side inclined line portion 127 and a transverse line portion 128. The transverse line portions 121, 123, 125 and 128 are extended linearly to the left and to the right. The positions of the transverse line portions 121 and 128 in the direction of depth are equal, and the side guides 94a and 94b are defined by the upper faces of these line portions 121 and 128, while the vertical line portion 121 is linearly extended in the direction of depth. The transverse line portion 123 is located, in the direction of depth, at the same position as the boundary point of the rear-side inclined line portion 126 and the slot-side inclined line portion 127.

For convenience sake, reference cross sections 130 and 131 are defined in the explanation. The reference cross sections 130 and 131 are cross sections, at a right angle relative to the direction of width of the PC slot device 20.

The reference cross section 130 is extended parallel to the direction of depth, and is separated at a distance d, in the direction of the sides, from the left end of the ExpressCard storage space 103. The reference cross section 131 passes through the center of the transverse width of the transverse line portion 125, and is parallel to the reference cross section 130. $\alpha 1$ is the intersection angle of the rear-side inclined line portion 126 relative to the reference cross section 131, while the clockwise direction is regarded as positive. $\alpha 2$ is the intersection angle of the slot-side inclined line portion 127 relative to the reference cross-section 131, while the clockwise direction is regarded as positive. In these cases, both $\alpha 1$ and $\alpha 2$ are positive values. It is preferable that the intersection angle of the inclined line portion 124, relative to the reference cross section 131, be $-\alpha 1$. Further, $\alpha 2 > \alpha 1$ is established to optimize guidance of the ExpressCards towards their respective male pins in the PC slot device 20. The reference cross section 131 need only be separated from the left end of the ExpressCard storage space 103 by a distance equal to or greater than d in the direction of the sides. In addition, d1<d2<d3 is established when d1 denotes the length of the transverse line portion 125, d2 denotes the length of the front end projection member 42b in the direction of the sides, and d3 denotes the distance between the front end of the inclined line portion 124 and the front end of the rear-side inclined line portion 126 in the direction of the sides.

For the insertion of the 34 mm wide ExpressCard 25b into the ExpressCard storage space 103, the user pushes the 34 mm wide ExpressCard 25b, while aligning the upper and lower positions of the ExpressCard 25b with the upper and lower positions of the slot of the ExpressCard storage space 103 of the PC slot device 20. However, since the thickness of the front end face of the ExpressCard 25b of 34 mm is almost equal to the height of the ExpressCard storage space 103, the top end or the bottom end of the front end face of the 34 mm wide ExpressCard 25b will hit the upper chassis ceiling wall 98 or the lower chassis of ceiling wall 100. When the upper end of the ExpressCard 25b of 34 mm wide hits the upper chassis ceiling wall 98, the user causes the front end of the 34 mm wide ExpressCard 25b to descend. However, normally, an appropriate descent is difficult, and the front end face of the 34 mm wide ExpressCard 25b is lowered too far. Thus, the front end face of the 34 mm wide ExpressCard 25b is brought into contact with the slot-side inclined line portion 127. Since the right upper level lower face portion 50 is located a little higher than the projection lower face 43 of the front end projection member 42b, the user must turn the 34 mm wide ExpressCard 25b slightly along the axial line in the insertion direction. Then, the right corner of the right upper level lower face portion 50 can be easily moved across the slot in the ExpressCard storage space 103, can run forward over the slot-side inclined line portion 127, and can enter the ExpressCard storage space 103, which is the upper portion of the lower chassis ceiling wall 100. Therefore, the right end of the front end projection member 42b of the 34 mm wide ExpressCard 25b, i.e., the front end of the right stepped portion 44b, will obliquely strike the slot-side inclined line portion 127 in the direction from the front to the rear.

When the user pushes in to drive the 34 mm wide ExpressCard 25b to the rear of the ExpressCard storage space 103, the front end of the right stepped portion 44b is guided along the slot-side inclined line portion 127 and is moved toward the rear-side inclined line portion 126. Accordingly, the 34 mm wide ExpressCard 25b is moved to the rear of the ExpressCard storage space 103. During this movement, the front end of the 34 mm wide ExpressCard 25b maintains its position, and is almost aligned in the ExpressCard storage space 103 in the direction of the sides. Further, because of the inclination angle of $\alpha 2$, the 34 mm wide ExpressCard 25b is displaced to the left as it is moved to the rear of the ExpressCard storage space 103. The front end of the right stepped portion 44b passes the rear end of the slot-side inclined line portion 127 and is guided to the rear, along the rear-side inclined line portion 126.

Figure 14:
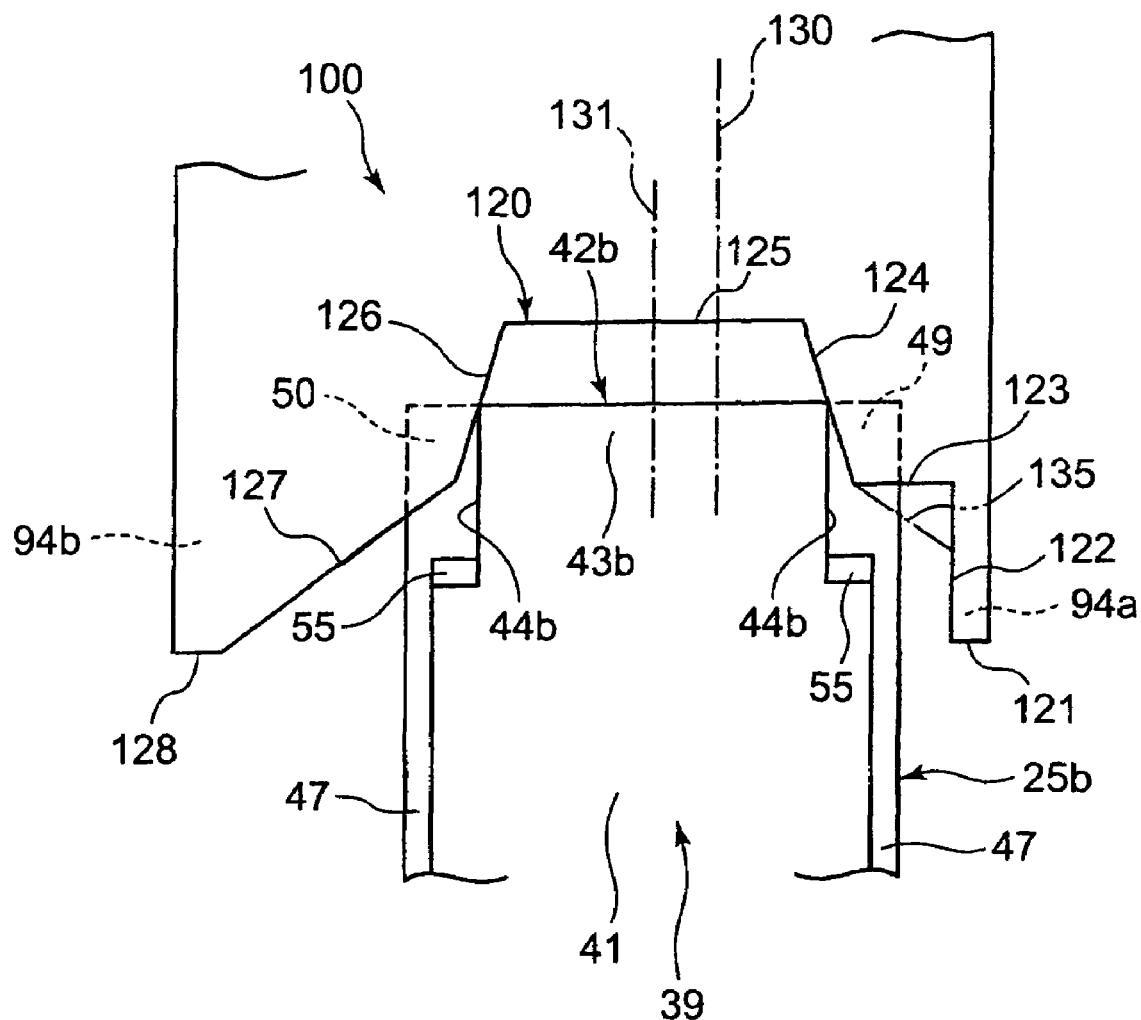
FIG. 14 is a diagram showing a positional relationship between the lower chassis ceiling wall and the 34 mm wide ExpressCard, as viewed from the lower face of the lower chassis ceiling wall, when the 34 mm wide ExpressCard, in the state shown in FIG. 13, has moved forward, to the rear, a predetermined distance.

FIG. 14 is a diagram showing the positional relationship of the lower chassis ceiling wall 100 and the 34 mm wide ExpressCard 25b, as viewed from the side of the lower face of the lower chassis ceiling wall 100, when the 34 mm wide ExpressCard 25b has moved to the rear a predetermined distance from the state in FIG. 13. When the front end face of the front end projection member 42b has entered, between the inclined line portion 124 and the rear-side inclined line portion 126, and when the front end of the 34 mm wide ExpressCard 25b reaches the position, in the direction from the front to the rear, at which the distance in the direction of the sides between the inclined line portion 124 and the rear-side inclined line portion 126 is equal to the length of the front end projection member 42b in the direction of the sides, the right and left ends of the front end projection member 42b contact the inclined line portion 124 and the rear-side inclined line portion 126, as shown in FIG. 14. In this state, the forward movement of the front end projection member 42b is inhibited. However, since among the stepped portions 44b there is little height difference, the forward movement force of the front end projection member 42b, or an appropriate propelling force applied by the user at the periphery, in the direction from the front to the rear, the front ends of the two stepped portions 44b can slide up across the inclined line portion 124 and the rear-side inclined line portion 126, move toward the ExpressCard storage space 103, and run up over the upper face of the lower chassis ceiling wall 100.

Hereafter, since the projection lower face 43b and the case lower face 41 slide across the upper face of the lower chassis ceiling wall 100, the 34 mm wide ExpressCard 25b moves to the rear, into the ExpressCard storage space 103. At this time, the right end of the front end face of the front end projection member 42b is guided to the left, while contacting the guide projection 118 provided in the ExpressCard storage space 103.

An inclined line portion 135 (FIGS. 13 and 14) may be formed for the slot side edge 120, instead of the transverse line portion 123, and the reference cross section 131 may be positioned by being shifted to the right, relative to the reference cross section 130. The section 131, however, may match the reference cross section 130, and in this case, the sizes of the vertical line portion 122 and the transverse line portion 123 should be designated so that the left inclined face 55 does not interfere with the slot side edge 120.

In order to clarify the correlation between the present invention and the following preferred embodiment of the present invention, reference numerals provided for a slot device, the components and the sections of the slot device used in the preferred embodiment are employed to describe a slot device according to the present invention, and the corresponding components and sections for the present invention. It should be noted that although the present invention is described with these reference numerals, the present invention is not limited to this preferred embodiment. Further, the terms of superordinate concept, or terms of another specific concept, for example, are employed for the slot device of the invention and the terms of the components and the sections, relative to the terms for the slot device, and the component and the sections of the preferred embodiment. Therefore, it should be noted that when reference numerals are identical, the term used in the invention may not be identical to the term used in the preferred embodiment.

Thus, as described herein, a slot device (20), according to the present invention, is a device into which a card type insertion/ejection member (25 or 25b) can be removably inserted. The card type insertion/ejection member (25 or 25b) has, on one thickness direction side at a front end face in the insertion direction, a stepped portion (44 or 44b); and widthwise at the front end face, an end portion (49 and 50) is bounded by the stepped portion (44 or 44b) and is thinner than a middle portion.

The slot device (20) of the present invention includes the following components: a plate-like defining member (100), for defining a storage space (103) on a first thickness direction side that is opposite a second thickness direction side of the card type insertion/ejection member (25 or 25b) in a state where the card type insertion/ejection member (25 or 25b) has been inserted into the storage space (103); oblique contact line portion (126, 127), which serves as slot side edges (120) of the plate-like defining member (100) and is obliquely extended, in the direction of the depth of the storage space (103), so as to obliquely contact the stepped portion (44 or 44b) while the card type insertion/ejection member (25 or 25b) is inserted into the storage space (103); and a widthwise movement inhibiting member (124) for contacting the other widthwise end of the card type insertion/ejection member (25 or 25b) to inhibit the movement of the card type insertion/ejection member (25 or 25b) toward the widthwise side end.

The slot device (20) is typically mounted in a notebook PC (10); however, it may be mounted in a desktop computer, or it may be provided as an external device for a PC. Typically, for a slot device (20) mounted in a notebook PC (10), the direction of the thickness and the direction of the width of the storage space (103) are respectively regarded as a vertical direction and a horizontal direction. When the slot device (20) is mounted in a desktop PC, or is used as an external device for a PC, the storage space (103) may be one wherein the card type insertion/ejection member (25 or 25b) is inserted vertically instead of transversely. For a slot device (20) wherein the card type insertion/ejection member (25 or 25b) is inserted vertically into the storage space (103), the direction of the thickness and the direction of the width off the storage space (103) are respectively regarded as a horizontal direction and a vertical direction.

As a card type insertion/ejection member (25 or 25b) is being inserted into the slot device (20), the widthwise end portion (50) is partially accepted by the storage space (103), while the front end of one stepped portion (44 or 44b) obliquely contacts, in the insertion direction, the contact line portions (126 and 127) of the slot side edge (120) of the plate-like defining member (100). Thereafter, as force continues to be applied to push the card type insertion/ejection member (25 or 25b) into the storage space (103), the front end of the stepped portion (44 or 44b) slides along the contact line portions (126 and 127) inside the storage space (103) in the direction of the thickness, and moves to the rear of the storage space (103). Through this operation, the card type insertion/ejection member (25 or 25b) is moved toward the other widthwise end; however, at the end, the travel of the card type insertion/ejection member (25 or 25b) to the widthwise end is prevented by the widthwise movement inhibiting member (124). As a result, with the force applied in the direction of the depth of the storage space (103), the stepped portion (44 or 44b) of the card type insertion/ejection member (25 or 25b) runs up along the contact line portions (126 and 127) of the plate-like defining member (100) toward the storage space (103) side. Accordingly, the entire front end face of the card type insertion/ejection member (25 or 25b) runs up over the plate-like defining member (100) toward the storage space (103) side.

According to the preferred slot device (20), the contact line portions (126 and 127) include first and second line portions (127 and 126) that are mutually adjacent in the direction of depth of the storage space (103). The first line portion (127) is laid, relative to the second segment line (126), on the slot side in the direction of depth of the storage space (103) and on one end side in the direction of width of the storage space (103). The second line portion (126) is laid forward from the first line portion (127), in the direction of depth of the storage space (103), at an angle to the direction of depth of the storage space (103). Typically, the first and second line portions (127 and 126) are straight lines; they may, however, be curved lines. Further, the boundary of the first and second line portions (127 and 126) may be at an angle (R).

Specifically, the card type insertion/ejection member (25 or 25b) includes: a first stepped portion (44), which is the above described stepped portion located on one side in the direction of thickness of the front end face in the direction of insertion; and a second stepped portion (44), which is located on the other side in the direction of width. For such a card type insertion/ejection member (25 or 25b) having the first and second stepped portions, the slot device (20) includes a third line portion (124). The third line portion (124) is formed as a part of the slot side edge (120) of the plate-like defining member (100), so that while the card type insertion/ejection member (25 or 25b) is inserted into the storage space (103), the third line portion (124) obliquely contacts the second stepped portion (44) in the direction of depth, and faces the second line portion (126) in the widthwise direction of the storage space (103). The third line portion (124) also serves as a widthwise movement inhibiting member, and the second and third line portions (126 and 124) are formed, so that the distance between the second and third line portions (126 and 124), in the widthwise direction of the storage space (103), is gradually reduced along depth of the storage space (103). Further, at the end position of the second line portion (126) on the slot side, a distance (defined as d3) between the second and the third line portions (126 and 124) in the widthwise direction of the storage space (103) is greater than a distance (defined as d2) between the first and second stepped portions in the widthwise direction.

Based on the above described size definitions (d2<d3 and the gradual reduction in the widthwise distance between the second and third line portions), the front end (43 or 43b) in the middle of the card type insertion/ejection member (25 or 25b) runs up over the end position of the second line portion (126) to the rear in the direction of depth of the storage space (103), and moves between the second and third line portions (126 and 124) in the widthwise direction. Finally, the front ends of the stepped portions (44 or 44b) on both widthwise sides contact the second and third line portions (126 and 124) in the insertion direction, and the displacement of the card type insertion/ejection member (25 or 25b) is inhibited in the direction of width. As a result, the force applied to insert the card type insertion/ejection member (25 or 25b) appropriately acts as the force for running the front ends of the stepped portions (44 or 44b) up over the second and third line portions (126 and 124) in the direction of depth of the storage space (103). Therefore, the front end (43 or 43b) in the middle of the card type insertion/ejection member (25 or 25b) can efficiently run up over the plate-like defining member (100) toward the storage space (103).

Specifically, for the card type insertion/ejection member (25 or 25b), the front end of the card type insertion/ejection member (25 or 25b) is shaped so as to be laterally symmetrical with the widthwise direction regarded as the horizontal direction. Further, in an overlapping range in the direction of depth of the storage space (103), the second and third line portions (126 and 124) are formed laterally symmetrical relative to a predetermined reference face (131), with the widthwise direction of the storage space (103) being regarded as the horizontal direction.

The card type insertion/ejection member (25 or 25b) is, for example, an ExpressCard (25 or 25b). One side face of the ExpressCard (25 or 25b) in the direction of thickness is the lower side face (39). Typically, the slot device (20) is an ExpressCard slot device (20). Furthermore, for the preferred slot card (20), the storage space (103) is an adjustable storage space (103) for storing both 34 mm wide and 54 mm wide ExpressCards (25 or 25b and 60).

The oblique contact line portions (126 and 127) of the present invention can also contribute to the smooth insertion of a 54 mm wide ExpressCard into the storage space (103) that is used in common for 34 mm wide and 54 mm wide ExpressCards (25 or 25b and 60), and the smooth insertion of a 34 mm wide ExpressCard (25 or 25b) into the dedicated storage space (103) for 34 mm wide ExpressCards (25 or 25b). In this case, the oblique contact line portions are formed at location appropriately near the ends of the plate-like defining member (100) in the widthwise direction.

According to the present invention, a predetermined card type insertion/ejection member (25 or 25b) is removably inserted into a slot device (20). A direction at a right angle to the thickness and to the width of the card type insertion/ejection member (25 or 25b) is defined as the insertion direction for the slot device (20). At a front end of one face of the card type insertion/ejection member (25 or 25b) in the direction of the thickness, a front end portion, which is a widthwise end portion, descends in the direction of thickness relative to a middle front end portion that serves as a widthwise center portion. This slot device (20) includes: a plate-like defining member (100), for defining a storage space (103), which is used to store the card type insertion/ejection member (25 or 25b) that is inserted, through a slot, on the side of a face that corresponds to a face in the direction of thickness of the card type insertion/ejection member (25 or 25b) that is stored in the storage space (103); and a widthwise movement inhibiting member (124), for contacting the other widthwise end of the card insertion/ejection member (25 or 25b) to inhibit the movement of the card type insertion/ejection member (25 or 25b) to the other widthwise end. A slot side edge (120), which is a slot side edge of the plate-like defining member (100), includes oblique contact line portion (126, 127) that is formed, so that, while the card type insertion/ejection member (25 or 25b) is inserted into the storage space (103), the oblique contact line portion (126, 127) at least partially receives the one front end portion of the card type insertion/ejection member (25 or 25b) on the side of the storage space (103), and obliquely contacts, in the direction of the insertion of the card type insertion/ejection member (25 or 25b), a front end of the step portion (44) that is a connector in the direction of the thickness of the one front end portion and the center front end portion of the card type insertion/ejection member (25 or 25b). The oblique contact line portion (126, 127) slides the front end of the step portion (44) in the direction of the thickness inside the storage space (103), and moves the center front portion up over the plate-like defining portion (100) to the storage space (103) side.

According to the invention, the card type insertion/ejection member, for which the front end, in the insertion direction, is not formed thinner than the succeeding portion, can be smoothly inserted into a slot without the thickness of the slot in the slot device being increased and without the structure of the slot device becoming complicated.

While the invention has been particularly shown and described with reference to a preferred embodiment, it will be understood by those skilled in the art that various changes in form and detail may be made therein without departing from the spirit and scope of the invention.

What is claimed is:

1. A slot device, into which a card type insertion/ejection member is removably inserted, wherein said card type insertion/ejection member has, on one thickness direction side at a front end face in an insertion direction, a stepped portion, and at the front end face, a widthwise end portion is bounded by said stepped portion and is thinner than a middle portion, and wherein said card type insertion/ejection member includes a first stepped portion on one side in the direction of width, which is the stepped portion located on one thickness direction side at the front end face in the direction of insertion, and a second stepped portion, which is located on the other side in the direction of width, so that said card type insertion/ejection member is removably inserted into said slot device, the slot device comprising:

a plate-like defining member, for defining a storage space on a first thickness direction side, that is opposite a second thickness direction side of said card type insertion/ejection member in a state where said card type insertion/ejection member has been inserted into said storage space;

an oblique contact line portion, which serves as slot side edge of said plate-like defining member and is obliquely extended, in the direction of the depth of said storage space, so as to obliquely contact said stepped portion while said card type insertion/ejection member is inserted into said storage space, wherein said oblique contact line portion includes first and second line portions that are disposed either at the slot side or at the rear side so as to be continuously arranged in said storage space in the direction of depth, and wherein said second line portion is shaped like a line from said first line portion along the depth of said storage space;

a widthwise movement inhibiting member for contacting the other widthwise end portion of said card type insertion/ejection member to inhibit the movement of said card type insertion/ejection member toward the other widthwise side end;

a third line portion which is formed as a part of said slot side edge of said plate-like defining member so that while said card type insertion/ejection member is inserted into said storage space, said third line portion obliquely contacts said second stepped portion in the direction of depth, and said third line portion faces said second line portion in the widthwise direction of said storage space, wherein said third line portion also serves as the widthwise movement inhibiting member, and said second and third line portions are formed so that the distance between said second and third line portions, in the widthwise direction of said storage space, is gradually reduced along the depth of said storage space; and wherein, at the end position of said second line portion on the slot side, a distance between said second and said third line portions in the widthwise direction of said storage space is greater than a distance between said first and second stepped portions in the widthwise direction.

2. The slot device according to claim 1, wherein said first and said second line portions are formed as straight lines.

3. The slot device according to claim 1, wherein the front end of said card type insertion/ejection member is shaped so as to be laterally symmetrical with the widthwise direction regarded as the horizontal direction; and wherein, in an overlapping range in the direction of depth of said storage space, said second and third line portions are formed laterally symmetrical relative to a predetermined reference face, with the widthwise direction of said storage space being regarded as the horizontal direction.

4. The slot device according to claim 1, wherein said card type insertion/ejection member is an ExpressCard, and one side face of said ExpressCard in the direction of thickness is the lower side face; and wherein said slot device is an ExpressCard slot device.

5. The slot device according to claim 4, wherein said storage space is an adjustable storage space for storing both 34 mm wide and 54 mm wide ExpressCards.

6. A computer comprising:

a slot device, into which a card type insertion/ejection member is removably inserted, wherein said card type insertion/ejection member has, on one thickness direction side at a front end face in an insertion direction, a stepped portion, and at the front end face, a widthwise end portion is bounded by said stepped portion and is thinner than a middle portion, and wherein said card type insertion/ejection member includes a first stepped portion on one side in the direction of width, which is the stepped portion located on one thickness direction side at the front end face in the direction of insertion, and a second stepped portion, which is located on the other side in the direction of width, so that said card type insertion/ejection member is removably inserted into said slot device, the slot device comprising:

a plate-like defining member, for defining a storage space on a first thickness direction side, that is opposite a second thickness direction side of said card type insertion/ejection member in a state where said card type insertion/ejection member has been inserted into said storage space;

an oblique contact line portion, which serves as slot side edge of said plate-like defining member and is obliquely extended, in the direction of the depth of said storage space, so as to obliquely contact said stepped portion while said card type insertion/ejection member is inserted into said storage space, wherein said oblique contact line portion includes first and second line portions that are disposed either at the slot side or at the rear side so as to be continuously arranged in said storage space in the direction of depth, and wherein said second line portion is shaped like a line from said first line portion along the depth of said storage space;

a widthwise movement inhibiting member for contacting the other widthwise end portion of said card type insertion/ejection member to inhibit the movement of said card type insertion/ejection member toward the other widthwise side end;

a third line portion which is formed as a part of said slot side edge of said plate-like defining member so that while said card type insertion/ejection member is inserted into said storage space, said third line portion obliquely contacts said second stepped portion in the direction of depth, and said third line portion faces said second line portion in the widthwise direction of said storage space, wherein said third line portion also serves as the widthwise movement inhibiting member, and said second and third line portions are formed so that the distance between said second and third line portions, in the widthwise direction of said storage space, is gradually reduced along the depth of said storage space; and wherein, at the end position of said second line portion on the slot side, a distance between said second and said third line portions in the widthwise direction of said storage space is greater than a distance between said first and second stepped portions in the widthwise direction.

* * * * *